(12) United States Patent
Chen et al.

(10) Patent No.: US 12,375,088 B2
(45) Date of Patent: Jul. 29, 2025

(54) VOLTAGE SCALING SYSTEM USED FOR REDUCING POWER CONSUMPTION

(71) Applicant: MediaTek Singapore Pte. Ltd., Singapore (SG)

(72) Inventors: Hsin-Chen Chen, San Jose, CA (US); Ashish Kumar Nayak, San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/271,847

(22) PCT Filed: Sep. 9, 2022

(86) PCT No.: PCT/CN2022/118128
§ 371 (c)(1),
(2) Date: Jul. 11, 2023

(87) PCT Pub. No.: WO2023/036297
PCT Pub. Date: Mar. 16, 2023

(65) Prior Publication Data
US 2024/0072808 A1 Feb. 29, 2024

Related U.S. Application Data

(60) Provisional application No. 63/242,070, filed on Sep. 9, 2021.

(51) Int. Cl.
*G06F 1/00* (2006.01)
*G06F 1/08* (2006.01)
(Continued)

(52) U.S. Cl.
CPC .............. *H03L 7/0802* (2013.01); *G06F 1/08* (2013.01); *G06F 1/324* (2013.01); *G06F 1/3296* (2013.01); *H03L 7/099* (2013.01)

(58) Field of Classification Search
CPC ......... H03L 7/0802; H03L 7/099; G06F 1/08; G06F 1/324; G06F 1/3296; G06F 1/26; Y02D 10/00
See application file for complete search history.

(56) References Cited

U.S. PATENT DOCUMENTS 11,171,658 B1 * 11/2021 Nakamura ............... H03L 1/022
2008/0048904 A1 * 2/2008 Lee ....................... H03L 7/0995
341/187

(Continued)

FOREIGN PATENT DOCUMENTS

WO 2021/035229 A2 2/2021

OTHER PUBLICATIONS

"International Search Report" mailed on Nov. 11, 2022 for International application No. PCT/CN2022/118128, International filing date: Sep. 9, 2022.

*Primary Examiner* — Xuxing Chen
(74) *Attorney, Agent, or Firm* — Winston Hsu

(57) ABSTRACT

A voltage scaling system can include an oscillator, a power management unit, a frequency meter, a table unit and a control unit. The oscillator is used to generate a clock signal according to a code and a power signal. The power management unit is used to generate the power signal according to a first control signal corresponding to a requested voltage. The frequency meter is used to measure a frequency of the clock signal and generate a second control signal accordingly. The table unit is used to generate a minimum code. The control unit is used to generate the code and the first control signal according to the second control signal, the minimum code and a target frequency.

16 Claims, 9 Drawing Sheets

(51) Int. Cl.
  *G06F 1/324*    (2019.01)
  *G06F 1/3296*   (2019.01)
  *H03L 7/08*     (2006.01)
  *H03L 7/099*    (2006.01)

(56) References Cited

U.S. PATENT DOCUMENTS

| | | |
|---|---|---|
| 2014/0191734 A1 | 7/2014 | Kuang |
| 2014/0254734 A1 | 9/2014 | Abdelmoneum |
| 2015/0326231 A1 | 11/2015 | Thinakaran |
| 2015/0333759 A1* | 11/2015 | Jung ................ G06F 1/324 |
| | | 327/158 |
| 2018/0123604 A1 | 5/2018 | Raja |
| 2022/0239284 A1* | 7/2022 | Yu .................. H03K 3/0231 |
| 2022/0404895 A1* | 12/2022 | Naito ................ G06F 1/06 |

* cited by examiner

VOLTAGE SCALING SYSTEM USED FOR REDUCING POWER CONSUMPTION

CROSS-REFERENCE TO RELATED APPLICATIONS

The present disclosure claims the priority benefit of U.S. Provisional Patent Application No. 63/242,070, filed on 9 Sep. 2021. The contents of aforementioned application are herein incorporated by reference in their entirety.

TECHNICAL FIELD

The disclosure is related to a voltage scaling system, and more particularly, a voltage scaling system used for reducing power consumption.

BACKGROUND

A processor, such as a central processing unit (CPU), requires a clock signal for operation. For example, an oscillator can be used to provide the clock signal. However, it's a challenge to control the frequency of the clock signal and the supply power to match the operation of the processor with considering power consumption. If the frequency of clock signal is too high, the CPU may fail to maintain safe operation. If the supply power is too high, the power consumption will be excessive. If the supply power is too low, the oscillator may fail to provide the clock signal with a frequency high enough to meet the performance requirement. Hence, a solution is in need to solve the problem.

SUMMARY

An embodiment can provide a voltage scaling system including an oscillator, a power management unit, a frequency meter, a table unit and a control unit. The oscillator is used to generate a clock signal according to a code and a power signal. The power management unit is used to generate the power signal according to a first control signal corresponding to a requested voltage. The frequency meter is used to measure a frequency of the clock signal and generate a second control signal accordingly. The table unit is used to generate a minimum code. The control unit is used to generate the code and the first control signal according to the second control signal, the minimum code and a target frequency.

Another embodiment can provide a voltage scaling system including a frequency lock loop circuit, a power management unit, a table unit and a control unit. The frequency lock loop circuit is used to generate a clock signal and a voltage adjustment signal according to a minimum code, a power signal and a target frequency. The power management unit is used to generate the power signal according to a first control signal corresponding to a requested voltage. The table unit is used to generate the minimum code. The control unit is used to generate the first control signal according to the voltage adjustment signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
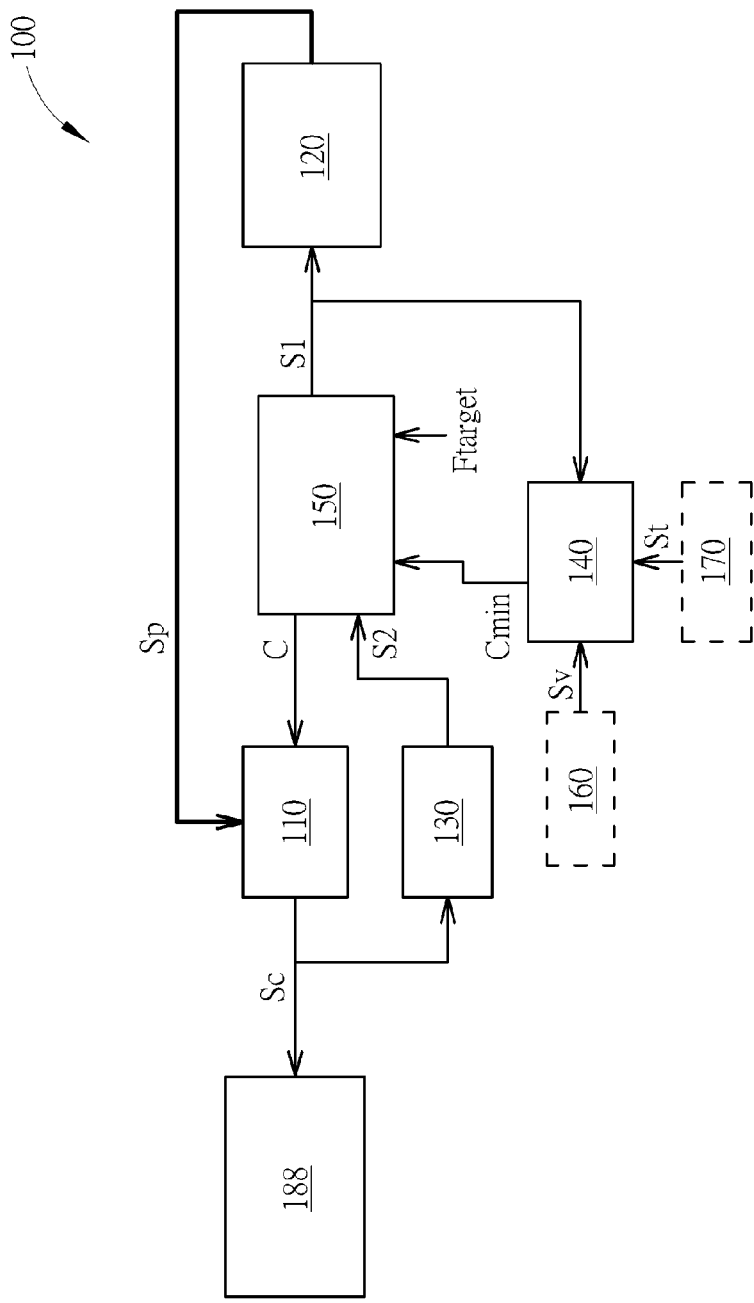
FIG. 1 illustrates a voltage scaling system according to an embodiment.

FIG. 1 illustrates a voltage scaling system 100 according to an embodiment. The voltage scaling system 100 can include an oscillator 110, a power management unit 120, a frequency meter 130, a table unit 140 and a control unit 150. The oscillator 110 can be used to generate a clock signal Sc according to a code C and a power signal Sp. The power management unit 120 can be used to generate the power signal Sp according to a first control signal S1 corresponding to a requested voltage, where the power signal Sp is corresponding to the supply voltage. The frequency meter 130 can be used to measure a frequency of the clock signal Sc and generate a second control signal S2 accordingly. The table unit 140 can be used to generate a minimum code Cmin. The control unit 150 can be used to generate the code C and the first control signal S1 according to the second control signal S2, the minimum code Cmin and a target frequency Ftarget. As shown in FIG. 1, the clock signal Sc can be outputted to a processor 188 so that the processor 188 can operate according to the frequency of the clock signal Sc. The minimum code Cmin can be related to highest allowable operation frequencies of the processor 188 at different supply voltages, and more details are mentioned below.

According to an embodiment, the processor 188 can be a central processing unit (CPU). The oscillator 110 can be a ring oscillator, such as a configurable ring oscillator. The power management unit 120 can be implemented in a power management integrated circuit (IC). The control system 150 can be implemented using the hardware and/or software of a microprocessor. The target frequency Ftarget may be related to a phase locked loop (PLL) circuit in use.

As shown in FIG. 1, the oscillator 110, the power management unit 120, the frequency meter 130, the table unit 140 and the control unit 150 of the voltage scaling system 100 can form a loop structure with the feedback function to dynamically adjust the power signal Sp and the code C. As a result, the power signal Sp can be iteratively adjusted to make the clock signal Sc match the target frequency Ftarget, and adaptively adjust the supply voltage to reduce the power consumption.

According to an embodiment, the table unit 140 can be used to generate the minimum code Cmin according to the first control signal S1 corresponding to the requested voltage. The minimum code Cmin can be looked up in the table unit 140 according to the first control signal S1.

According to an embodiment, the voltage scaling system 100 can further include a voltage meter 160 used to measure an operation voltage to generate a voltage signal Sv accordingly. For example, the operation voltage can be the actual voltage in used on the silicon die. The minimum code Cmin can be generated according to the voltage signal Sv. The minimum code Cm can be looked up in the table unit 140 according to the first control signal S1 and/or the voltage signal Sv. By using the voltage meter 160, the obtained minimum code Cmin can better match the actual operation of the circuit.

Figure 2:
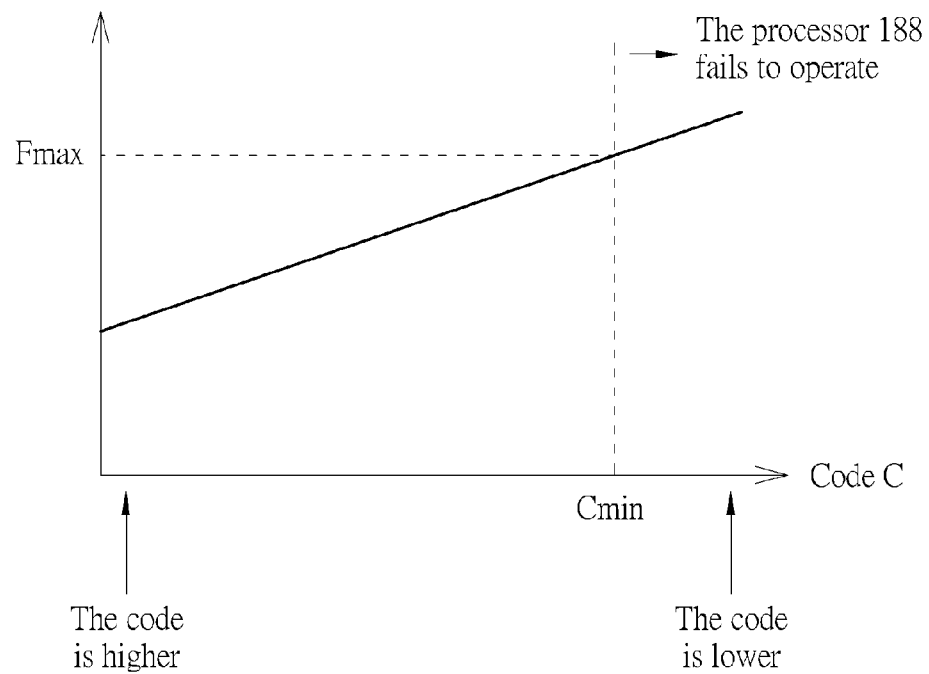
FIG. 2 illustrates a diagram of the relationship of the frequency of the clock signal and the code C according to an embodiment.

FIG. 2 shows a diagram of the relationship of the frequency of the clock signal Sc and the code C according to an embodiment. In FIG. 2, the vertical axis is corresponding to the frequency of the clock signal Sc in FIG. 1, and the horizontal axis is corresponding to the value of the code C in FIG. 1. As shown in FIG. 2, the frequency of the clock signal Sc can be higher when the code C is lower. However, when the frequency of the clock signal Sc reaches the highest allowable operation frequency (expressed as Fmax), the frequency of the clock signal Sc is not allowed to be increased. The processor 188 may fail to properly operate if the frequency of the clock signal Sc exceeds the highest allowable operation frequency Fmax. Hence, as shown in FIG. 2, the code C can be decreased to obtain the minimum code Cmin corresponding to the highest allowable operation frequency Fmax.

Figure 3:
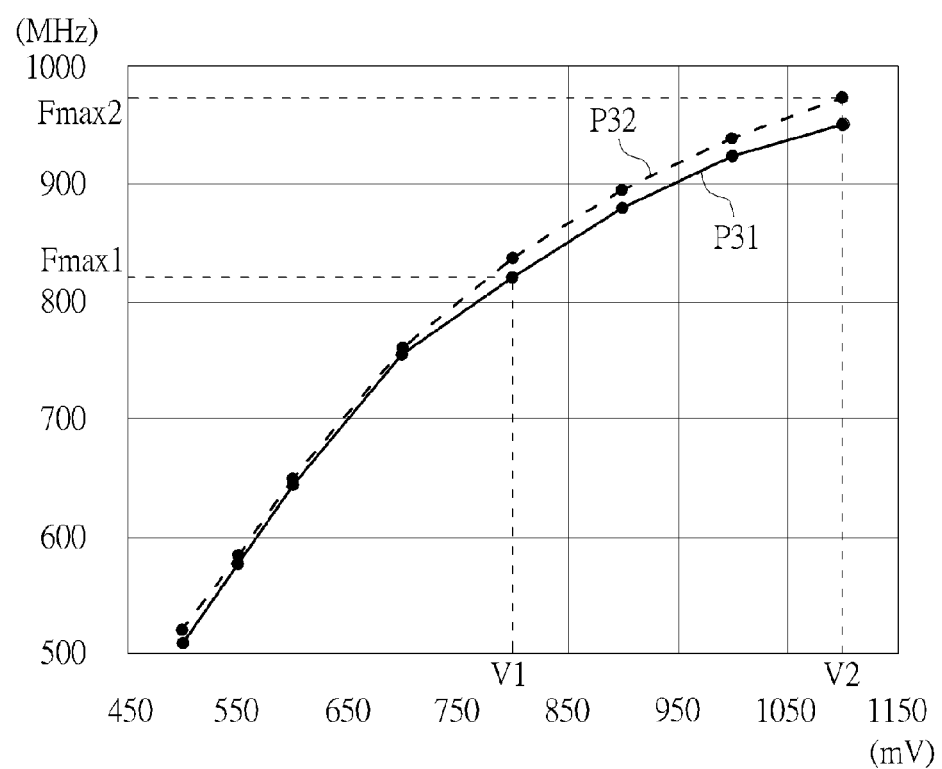
FIG. 3 illustrates a diagram of the relationship of the highest allowable operation frequency and the supply voltage controlled by the power management unit according to an embodiment.

According to an embodiment, the code C can be decreased to increase the frequency of the clock signal Sc to generate the highest allowable operation frequency Fmax while the supply voltage is substantially fixed. FIG. 3 shows a diagram of the relationship of the highest allowable operation frequency Fmax and the supply voltage controlled by the power management unit 120 according to an embodiment. In FIG. 3, the curves P31 and P32 are generated using two different test patterns, and the curves P31 and P32 can show the trend of the highest allowable operation frequency Fmax versus the supply voltage. As shown by the curve P31, when the voltage V1 is in use, the code C can be decreased to increase the frequency of the clock signal Sc to obtain the highest allowable operation frequency Fmax1 while the supply voltage V1 is substantially fixed. As shown by the curve P32, when the voltage V2 is in use, the code C can be decreased to increase the frequency of the clock signal Sc to obtain the highest allowable operation frequency Fmax2 while the supply voltage V2 is substantially fixed.

By dynamically applying different minimum codes Cmin related to different supply voltages, the operation of the oscillator 110 in FIG. 1 can be optimized to provide the clock signal Sc with proper frequencies in different condition. According to an embodiment, the code C can be adjusted only when the range of the supply voltage change is large (e.g. larger than 400 mV), and the transient instability caused by the voltage change can be dealt with by the oscillator 110 without affecting the system.

Figure 4:
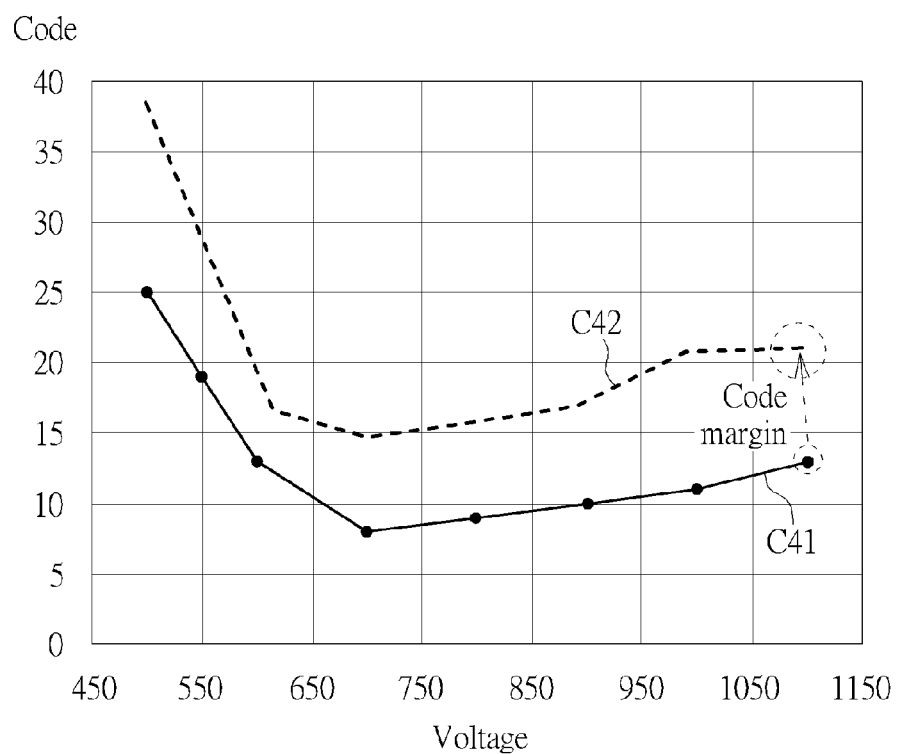
FIG. 4 illustrates a diagram of the relationship of the minimum value, the minimum code and the supply voltage according to an embodiment.

According to an embodiment, a code margin can be optionally used to improve the stability of the operation. According to an embodiment, the frequency of the clock signal Sc can be higher when the code C is smaller, the code C can be decreased to obtain a minimum value (expressed as Cmin_FT) corresponding to a highest allowable operation frequency Fmax, and the minimum value Cmin_FT can be added with a code margin to generate the minimum code Cmin. FIG. 4 shows a diagram of the relationship of the minimum value Cmin_FT, the minimum code Cmin and the supply voltage according to an embodiment. In FIG. 4, the curve C41 can be corresponding to the minimum values Cmin_FT under different supply voltages, and the curve C41 can be corresponding to the minimum codes Cmin under different supply voltages. For example, the curve C41 can be obtained through the post-silicon test by measuring a circuit on a die. As shown in FIG. 4, a code margin can be added to the minimum values Cmin_FT to generate the curve C42.

Figure 5:
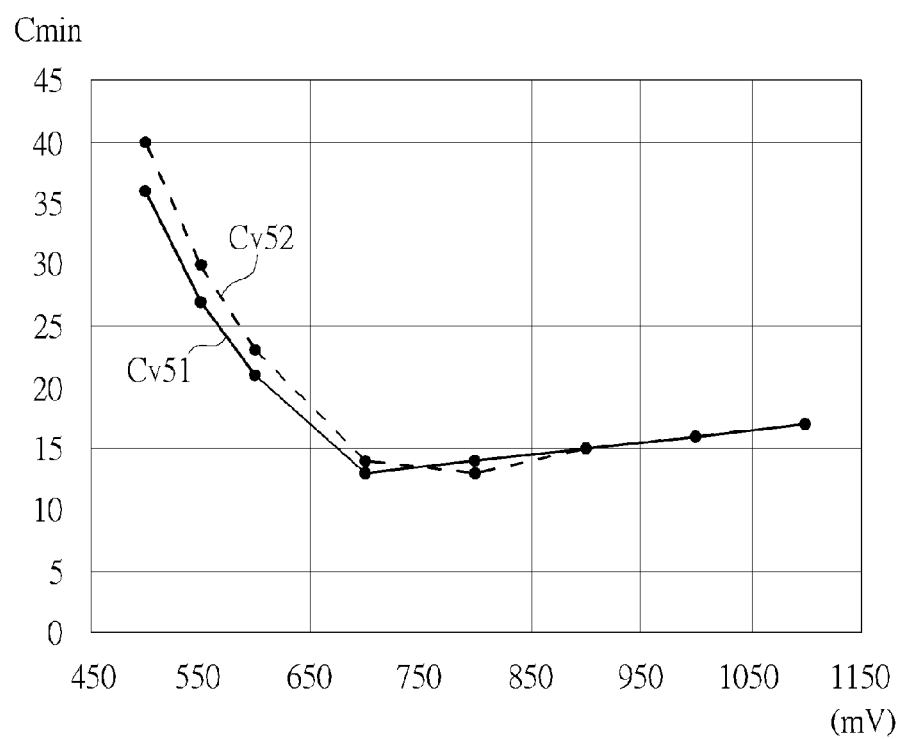
FIG. 5 illustrates the relationship of the minimum code and the supply voltage under different temperatures according to an embodiment.

According to an embodiment, the voltage scaling system 100 can optionally include a temperature sensor 170 (shown in FIG. 1) to measure an operation temperature and generate a temperature signal St accordingly. According to an embodiment, the minimum code Cmin can be generated according to the operation temperature. The operation temperature can be actual temperature measured on a die. FIG. 5 shows the relationship of the minimum code Cmin and the supply voltage under different temperatures according to an embodiment. The curve Cv51 can be corresponding to a higher temperature, and the curve Cv52 can be corresponding to a room temperature. As shown in FIG. 5, in the same workload condition, the minimum code Cmin may vary when the operation temperature changes.

Figure 6:
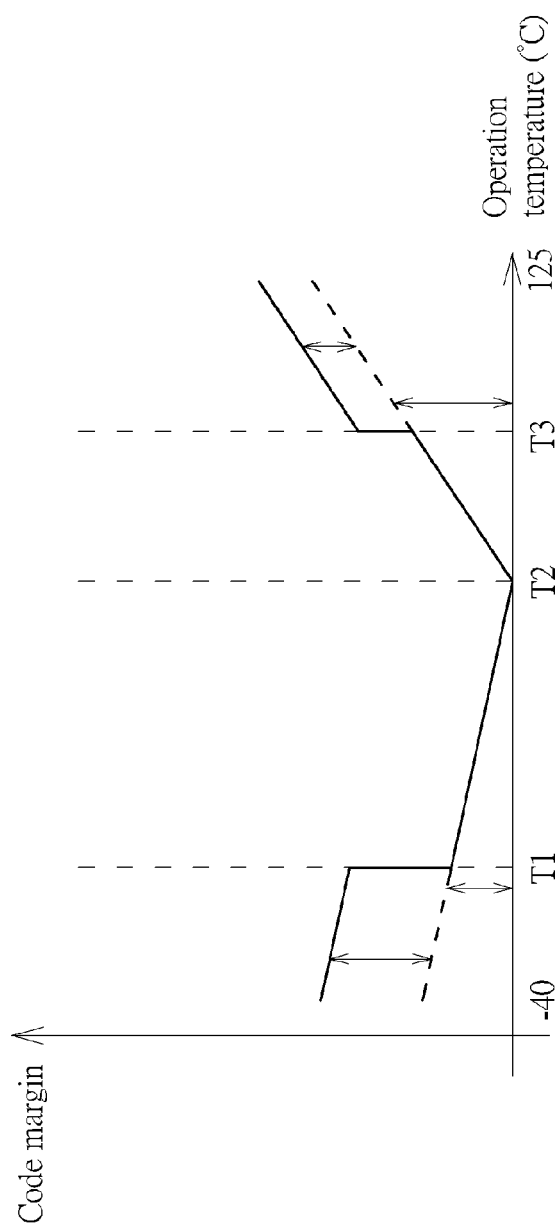
FIG. 6 illustrates the relationship of the code margin and the operation temperature according to an embodiment.

As for the abovementioned code margin used for adjusting the minimum code Cmin, the code margin can be adjusted when the operation temperature changes, and the minimum code corresponding to the operation temperature may not be measured in post-silicon test. FIG. 6 shows the relationship of the code margin and the operation temperature according to an embodiment. As shown in FIG. 6, the code margin can be a minimum margin (e.g. zero) when the operation temperature is the temperature T2. The reason is, the data in the table unit 140 (shown in FIG. 1) can be generated with measurement performed under the temperature T2, so the minimum code Cmin corresponding to the temperature T2 can be used with a smallest adjustment or even without adjustment. However, in the range between the temperatures T1 and T3, if the difference of the operation temp and T2 increases, the code margin can be increased for the safety of the operation of the processor 188. According to an embodiment, in the range between the temperatures T1 and T3, if the difference of the operation temp and T2 increases, the code margin can be increased linearly.

As shown in FIG. 6, when the operation temperature is lower than T1 or higher than T3, it means the system may be operated in an extreme environment, so the code margin can be further increased to increase the minimum code Cmin for decreasing the frequency of the clock signal Sc so as to operate the processor 188 without failure.

Figure 7:
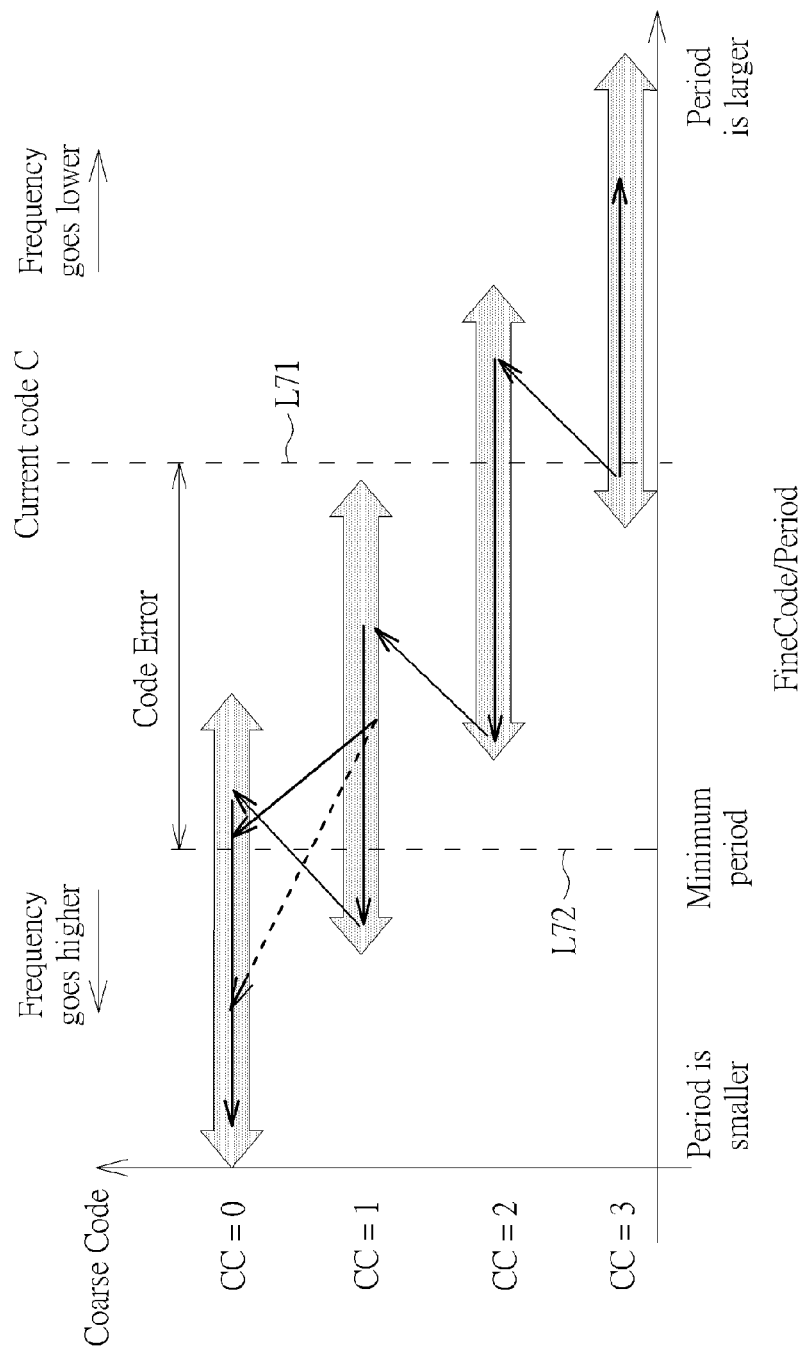
FIG. 7 illustrates the relationship of the coarse code and the fine code according to an embodiment.

According to an embodiment, the oscillator 110 can include m coarse control stages and n fine control stages used to adjust the frequency of the clock signal Sc. Each of the m coarse control stages is corresponding to a first frequency step. Each of the n fine control stages is corresponding to a second frequency step smaller than the first frequency step. Here, m and n can be integers larger than 1. FIG. 7 shows the relationship of the coarse code and the fine code according to an embodiment. The coarse code can be related to the coarse control stages of the oscillator, and the fine code can be related to the fine control stages of the oscillator. In FIG. 7, the horizontal axis is corresponding to the period and the fine code, and the vertical axis is corresponding to the value of the coarse code. When the period is larger, the frequency of the clock signal Sc is lower. FIG. 7 is an example in which the coarse code can be 0, 1, 2, or 3. The line L71 can be corresponding to the current code C in use. The line L72 can be corresponding to a minimum period related to the highest frequency of the operation of the processor 188.

As shown in FIG. 7, an ith coarse control stage of the m coarse control stages can be corresponding to an ith minimum fine code, an (i+1)th coarse control stage of the m coarse control stages can be corresponding to an (i+1)th minimum fine code greater than the ith minimum fine code. Here, i can be an integer, and 0<i≤(m−1). For example, the first coarse code (e.g. CC=1 in FIG. 7) can be corresponding to a first minimum fine code, and the second coarse code (e.g. CC=2 in FIG. 7) can be corresponding to a second minimum fine code greater than the first minimum fine code.

Figure 8:
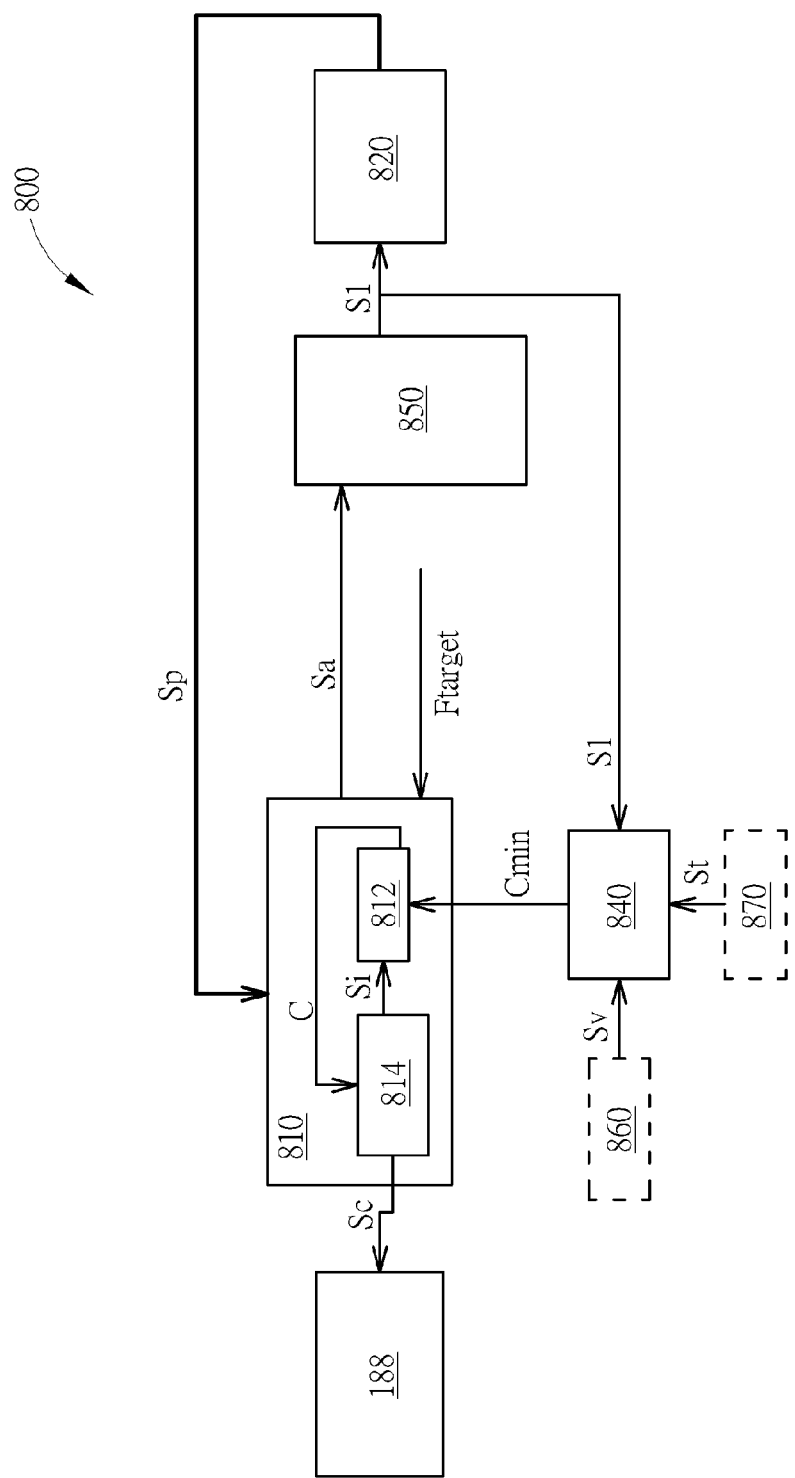
FIG. 8 illustrates a voltage scaling system according to another embodiment.

FIG. 8 illustrates a voltage scaling system 800 according to another embodiment. The voltage scaling system 800 can include a frequency lock loop circuit 810, a power management unit 820, a table unit 840 and a control unit 850. The frequency lock loop circuit 810 can be used to generate a clock signal Sc and a voltage adjustment signal Sa according to a minimum code Cmin, a power signal Sp and a target frequency Ftarget. The power management unit 820 can be used to generate the power signal Sp according to a first control signal S1 corresponding to a requested voltage. The table unit 840 can be used to generate a minimum code Cmin. The control unit 850 can be used to generate the first control signal S1 according to the voltage adjustment signal Sa, The operation of the power management unit 820 can be similar to the operation of the power management unit 120 in FIG. 1, so it is not repeatedly described.

The voltage scaling system 800 can optionally include the voltage meter 860 and/or the temperature sensor 870. The voltage meter 860 can measure an operation voltage and generate a voltage signal Sv accordingly. The temperature sensor 870 can measure an operation temperature and generate a temperature signal St accordingly.

The operation of the table unit 840 can be similar to the operation of the table unit 140 in FIG. 1, and the minimum code Cmin can be looked up and generated using the table unit 840 according to at least one of the temperature signal St, the operation voltage and the first control signal S1, so it is not repeatedly described. Each of the table units 140 and 840 can include a lookup table.

As shown in FIG. 8, the frequency lock loop circuit 810 can include a controller 812 and an oscillator 814. The controller 812 can receive the minimum code Cmin and an inner control signal S1, and the controller 812 can generate the voltage adjustment signal Sa and generate an oscillator code C to adjust the oscillation frequency so that the frequency of the clock signal Sc can match the target frequency Ftarget. The oscillator 814 can receive the code C, and generate the clock signal Sc and the inner control signal S1 accordingly. For example, the inner control signal S1 can be corresponding to the frequency of the clock signal Sc. For example, the oscillator 814 can be a configurable ring oscillator. The frequency lock loop circuit 810 can have a loop structure and operate with a feedback function to lock the frequency. The structure of the frequency lock loop circuit 810 can allow the frequency lock loop circuit 810 to adjust the frequency of the clock signal Sc independently without being affected by the power signal Sp that is controlled by the power management unit 820.

According to an embodiment, the oscillator 814 can be similar to the oscillator 110 in FIG. 1 to include a set of coarse control stages and a set of fine control stages as described above, and it is not repeatedly described.

Similar to the voltage scaling system 100, in voltage scaling system 800, according to an embodiment, the frequency of the clock signal Sc can be higher when the code C is smaller, and the code C can be decreased to obtain the minimum code Cmin corresponding to a highest allowable operation frequency of the processor 188.

According to another embodiment, the code C can be decreased to obtain the minimum value (expressed as Cmin_FT) corresponding to a highest allowable operation frequency, and the minimum value Cmin_FT can be added with a code margin to generate the minimum code Cmin. According to an embodiment, the code margin can be adjusted according to the operation temperature measured by the temperature sensor 870.

According to an embodiment, when a frequency of the clock signal Sc is lower than the target frequency Ftarget, the voltage adjustment signal Sa can be used to increase the supply voltage corresponding to the power signal Sp. For example, in this condition, it can be expressed as a frequency error is larger than zero and expressed as FreqErr>0.

According to an embodiment, when a frequency of the clock signal Sc matches the target frequency Ftarget, and a frequency corresponding to the code C is higher than a highest allowable operation frequency corresponding to the minimum code Cmin, the voltage adjustment signal Sa can be used to decrease the supply voltage corresponding to the power signal Sp. In this condition, it can be expressed as a frequency error is zero and a code error is larger than zero, and expressed as FreqErr=0 & CodeErr>0.

Figure 9:
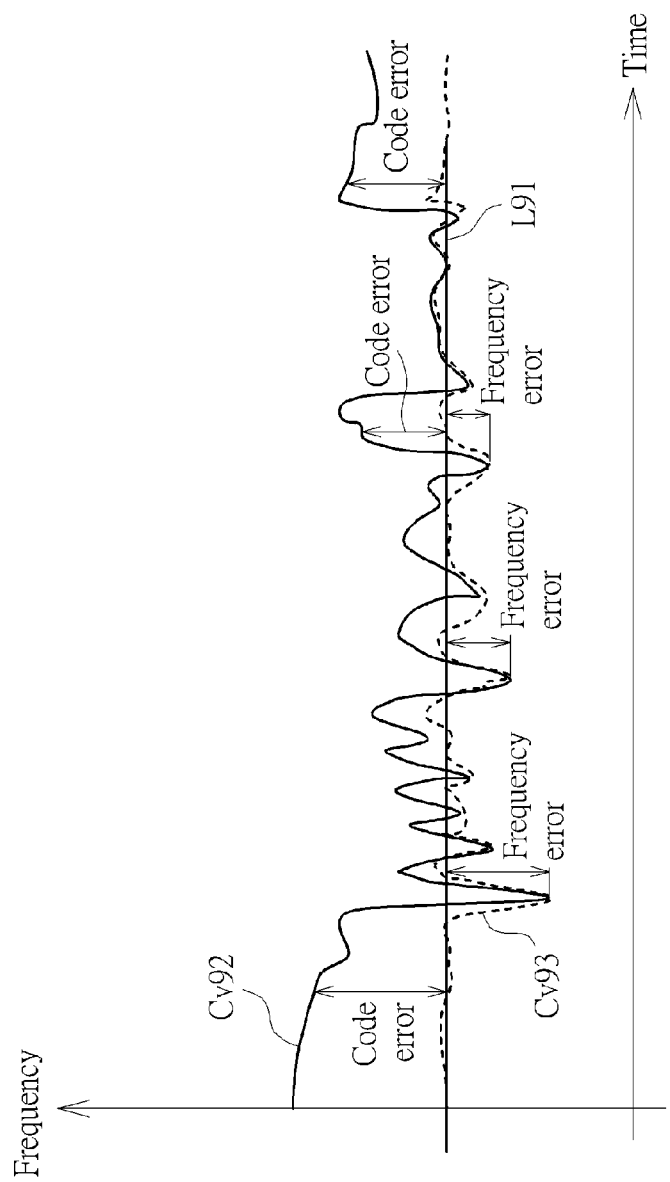
FIG. 9 illustrates an example to show the frequency error and the code error.

FIG. 9 illustrates an example to show the frequency error and the code error mentioned above. In FIG. 9, the line L91 can be corresponding to the target frequency Ftarget, the curve Cv92 can be corresponding to the highest allowable operation frequency corresponding to the minimum code Cmin, and the curve Cv93 can be corresponding to the frequency of the clock signal Sc. As shown in FIG. 9, the code error and the frequency error is shown in the example.

In summary, by using the voltage scaling systems 100 and 800, the frequency of the clock signal Sc can be dynamically adjusted and the supply voltage can be adaptively controlled. The effect of the operation voltage and the operation temperature can be taken into account when the minimum code Cmin is generated for calculating the frequency of the clock signal Sc. As a result, the power consumption can be effectively reduced while the processor 188 operates safely without failure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage scaling system comprising:
an oscillator configured to generate a clock signal according to a code and a power signal;
a power management unit configured to generate the power signal according to a first control signal corresponding to a requested voltage;
a frequency meter configured to measure a frequency of the clock signal and generate a second control signal accordingly;
a table unit configured to generate a minimum code; and
a control unit configured to generate the code and the first control signal according to the second control signal, the minimum code and a target frequency;
wherein the frequency of the clock signal is higher when the code is smaller, the code is decreased to obtain a minimum value corresponding to a highest allowable operation frequency, and the minimum value is added with a code margin to generate the minimum code.

2. The voltage scaling system of claim 1, wherein the minimum code is generated according to the requested voltage.

3. The voltage scaling system of claim 1, further comprising:
a voltage meter configured to measure an operation voltage;
wherein the minimum code is generated according to the operation voltage.

4. The voltage scaling system of claim 1 further comprising:
a temperature sensor configured to measure an operation temperature;
wherein the minimum code is generated according to the operation temperature.

5. The voltage scaling system of claim 1, wherein the code margin is related to an operation temperature.

6. The voltage scaling system of claim 1, wherein the code is decreased to increase the frequency of the clock signal to generate the highest allowable operation frequency while a supply voltage is substantially fixed.

7. The voltage scaling system of claim 1, wherein:
the oscillator comprises m coarse control stages and n fine control stages configured to adjust the frequency of the clock signal;
each of the m coarse control stages is corresponding to a first frequency step;
each of the n fine control stages is corresponding to a second frequency step smaller than the first frequency step; and
m and n are integers larger than 1.

8. The voltage scaling system of claim 7, wherein an ith coarse control stage of the m coarse control stages is corresponding to an ith minimum fine code, an (i+1)th coarse control stage of the m coarse control stages is corresponding to an (i+1)th minimum fine code greater than the ith minimum fine code, i is an integer, and $0 < i \leq (m-1)$.

9. A voltage scaling system comprising:
a frequency lock loop circuit configured to generate a clock signal and a voltage adjustment signal according to a minimum code, a power signal and a target frequency;
a power management unit configured to generate the power signal according to a first control signal corresponding to a requested voltage;
a table unit configured to generate the minimum code; and
a control unit configured to generate the first control signal according to the voltage adjustment signal;
wherein a frequency of the clock signal is higher when a code is smaller, the code is decreased to obtain a minimum value corresponding to a highest allowable operation frequency, and the minimum value is added with a code margin to generate the minimum code.

10. The voltage scaling system of claim 9, wherein the minimum code is generated according to the requested voltage.

11. The voltage scaling system of claim 9, further comprising:
a voltage meter configured to measure an operation voltage;
wherein the minimum code is generated according to the operation voltage.

12. The voltage scaling system of claim 9, wherein the frequency lock loop circuit comprises:
a controller configured to receive the minimum code, a signal corresponding to the target frequency and an inner control signal corresponding to the frequency of the clock signal, and generate the voltage adjustment signal and the code according to the minimum code, the signal corresponding to the target frequency and the inner control signal; and
an oscillator configured to receive the code, and generate the clock signal and the inner control signal accordingly.

13. The voltage scaling system of claim 12, wherein:
the oscillator comprises m coarse control stages and n fine control stages configured to adjust the frequency of the clock signal;
each of the m coarse control stages is corresponding to a first frequency step;
each of the n fine control stages is corresponding to a second frequency step smaller than the first frequency step; and
m and n are integers larger than 1.

14. The voltage scaling system of claim 9, further comprising:
a temperature sensor configured to measure an operation temperature;
wherein the minimum code is generated according to the operation temperature.

15. The voltage scaling system of claim 9, wherein when the frequency of the clock signal matches the target frequency, and a frequency corresponding to the code is higher than the highest allowable operation frequency corresponding to the minimum code, the voltage adjustment signal is used to decrease a supply voltage.

16. The voltage scaling system of claim 9, wherein when the frequency of the clock signal is lower than the target frequency, the voltage adjustment signal is used to increase a supply voltage.

* * * * *